US012668094B2

(12) United States Patent (10) Patent No.: US 12,668,094 B2
Yamamoto et al. (45) Date of Patent: Jun. 30, 2026

(54) APPARATUS MODULE

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Yasuyuki Yamamoto, Osaka (JP); Kosuke Sone, Osaka (JP); Tatsumi Sato, Osaka (JP); Takuya Taniguchi, Osaka (JP); Ai Takehisa, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 246 days.

(21) Appl. No.: 18/561,052

(22) PCT Filed: Apr. 27, 2022

(86) PCT No.: PCT/JP2022/019067
§ 371 (c)(1),
(2) Date: Nov. 15, 2023

(87) PCT Pub. No.: WO2022/244610
PCT Pub. Date: Nov. 24, 2022

(65) Prior Publication Data
US 2024/0227491 A1 Jul. 11, 2024

(30) Foreign Application Priority Data
May 17, 2021 (JP) ................................. 2021-083191

(51) Int. Cl.
B60H 1/00 (2006.01)
B60R 16/02 (2006.01)
(Continued)

(52) U.S. Cl.
CPC ......... B60H 1/00207 (2013.01); B60R 16/02 (2013.01); H05K 7/20 (2013.01); H10W 40/73 (2026.01); B60H 2001/00235 (2013.01)

(58) Field of Classification Search
CPC ...... B60H 1/00207; B60H 2001/00235; B60R 16/02; H05K 7/20; H01L 23/427
(Continued)

(56) References Cited

U.S. PATENT DOCUMENTS 3,618,854 A * 11/1971 Frank ..................... B60H 1/025
165/96
3,738,702 A * 6/1973 Jacobs ................. B60N 2/5614
219/202
(Continued)

FOREIGN PATENT DOCUMENTS

CN 107733354 2/2018
GB 2557422 A * 6/2018 ............. H05K 1/162
(Continued)

OTHER PUBLICATIONS

International Search Report issued in International Patent Application No. PCT/JP2022/019067, dated Jul. 26, 2022.
(Continued)

*Primary Examiner* — Ljiljana V. Ciric
(74) *Attorney, Agent, or Firm* — GREENBLUM & BERNSTEIN, P.L.C.

(57) ABSTRACT

An apparatus module includes: a rigid member disposed in an in-roof space between a roof panel and an interior member in a vehicle to be fixed to the roof panel; and an apparatus fixed to the rigid member. The rigid member is provided with a heat receiving part having contact with the apparatus to receive heat from the apparatus and a heat radiation part radiating heat received by the heat receiving part, the heat receiving part and the heat radiation part are
(Continued)

provided in positions away from each other in a surface of the rigid member, and heat is transferred from the heat receiving part to the heat radiation part via a heat transfer path connecting the heat receiving part and the heat radiation part in the rigid member.

11 Claims, 12 Drawing Sheets

(51) Int. Cl.
    *H05K 7/20* (2006.01)
    *H10W 40/73* (2026.01)
(58) Field of Classification Search
    USPC ..................................................... 165/41, 42
    See application file for complete search history.

(56) References Cited

U.S. PATENT DOCUMENTS

| | | | | |
|---|---|---|---|---|
| 4,051,692 | A * | 10/1977 | Ku | B60H 1/3202 62/309 |
| 4,133,376 | A * | 1/1979 | Eilenberg | F28D 15/0266 165/135 |
| 4,658,599 | A * | 4/1987 | Kajiwara | F28D 15/0266 62/235.1 |
| 4,869,313 | A * | 9/1989 | Fredley | F28F 13/187 165/41 |
| 5,036,905 | A * | 8/1991 | Eninger | B64G 1/506 244/172.6 |
| 5,042,567 | A * | 8/1991 | Kajimoto | B60H 1/246 454/145 |
| 5,950,710 | A * | 9/1999 | Liu | F28D 15/06 165/41 |
| 6,230,790 | B1 * | 5/2001 | Hemingway | H05K 7/20336 165/274 |
| 6,446,706 | B1 * | 9/2002 | Rosenfeld | F28D 15/046 165/905 |
| 6,866,092 | B1 * | 3/2005 | Molivadas | F01L 3/12 165/47 |
| 6,964,294 | B2 * | 11/2005 | Hendricks | H05K 7/20881 165/41 |
| 7,530,386 | B2 * | 5/2009 | Nagayama | B60H 1/00295 165/41 |
| 7,845,159 | B2 * | 12/2010 | Venkataramani | F02C 7/14 60/39.08 |
| 8,297,070 | B2 * | 10/2012 | Pryor | F25D 3/14 62/259.3 |
| 9,103,605 | B2 * | 8/2015 | Mornet | H01L 23/3733 |
| 9,546,826 | B1 * | 1/2017 | Carter | H01L 23/427 |
| 9,555,688 | B2 * | 1/2017 | Line | B60H 1/00328 |
| 9,868,551 | B2 * | 1/2018 | Smith | F28F 1/16 |
| 10,101,099 | B2 * | 10/2018 | Benthem | B64G 1/58 |
| 10,720,881 | B2 * | 7/2020 | Malek | H02S 40/425 |
| 10,787,204 | B2 * | 9/2020 | Durkin | B62D 25/12 |
| 11,071,205 | B2 * | 7/2021 | Tomar | B60R 16/02 |
| 11,890,923 | B2 * | 2/2024 | Moradnia | B60K 11/04 |
| 11,949,143 | B2 * | 4/2024 | Yamashita | H01Q 1/44 |
| 12,398,704 | B2 * | 8/2025 | Duong | B64G 1/503 |
| 2008/0123298 | A1 | 5/2008 | Takeguchi et al. | |
| 2016/0129839 | A1 | 5/2016 | Kim | |
| 2018/0048262 | A1 | 2/2018 | Malek et al. | |
| 2021/0197646 | A1 * | 7/2021 | Argento | B60H 1/00207 |
| 2024/0227491 | A1 * | 7/2024 | Yamamoto | H05K 7/20 |

FOREIGN PATENT DOCUMENTS

| | | | | |
|---|---|---|---|---|
| GB | 2579924 A | * | 7/2020 | ............. H05K 1/181 |
| JP | 2001-48056 | | 2/2001 | |
| JP | 2004-288913 | | 10/2004 | |
| JP | 2004-306932 | | 11/2004 | |
| JP | 2005-239133 | | 9/2005 | |
| JP | 2008-130037 | | 6/2008 | |
| JP | 2020-195124 | | 12/2020 | |
| WO | 2007/010655 | | 1/2007 | |
| WO | WO-2018065585 A1 | * | 4/2018 | ............. H05K 1/162 |
| WO | WO-2020153344 A1 | * | 7/2020 | ............. H01Q 1/22 |
| WO | WO-2021054379 A1 | * | 3/2021 | ............. B60K 35/60 |

OTHER PUBLICATIONS

International Preliminary Report on Patentability issued in International Patent Application No. PCT/JP2022/019067, dated Aug. 21, 2023.
Japan Office Action issued in JP Application No. 2021-083191, dated Jun. 18, 2024.
China, Official Action and Search Report received in CN Application No. 202280032215.4, dated Feb. 12, 2026, and English language translation.

* cited by examiner

F I G. 3
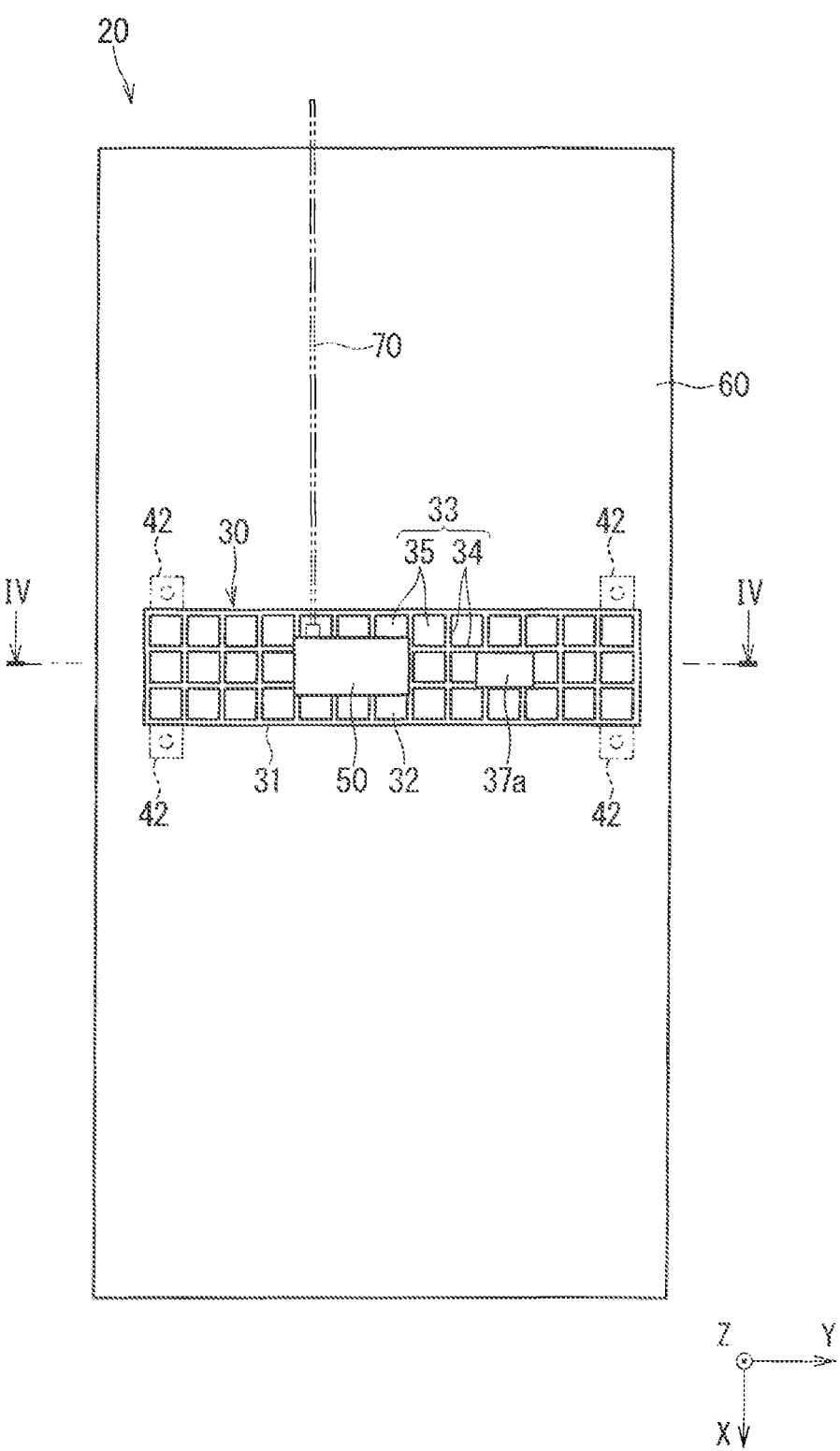

F I G. 7
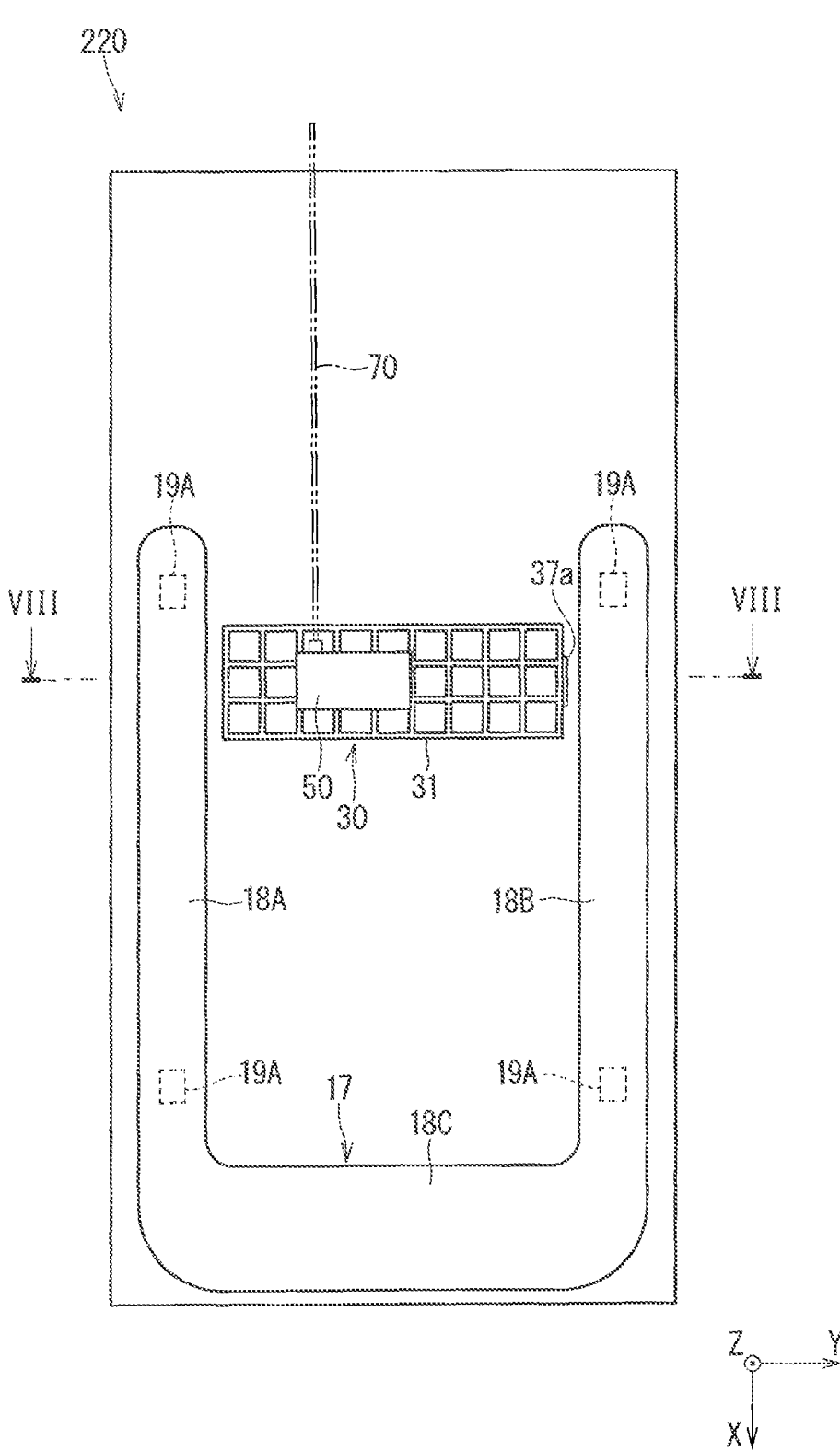

APPARATUS MODULE

TECHNICAL FIELD

The present disclosure relates to an apparatus module.

BACKGROUND ART

Patent Document 1 discloses a vehicle overhead module. In the vehicle overhead module described in Patent Document 1, an electrical apparatus and a cold storage material are housed in a heat insulation case, thus the electrical apparatus having low heat resistance can also be used.

PRIOR ART DOCUMENTS

Patent Document(s)

Patent Document 1: Japanese Patent Application Laid-Open No. 2005-239133

SUMMARY

Problem to be Solved by the Invention

The vehicle overhead module described in Patent Document 1 has a configuration of housing the electrical apparatus in the heat insulation case, thus there is a possibility that the number of electrical apparatuses which can be housed is small or assembly workability of the overhead module and maintainability of the electrical apparatus are deteriorated.

Accordingly, an object is to provide a technique capable of performing measures against heat on an apparatus even when the apparatus is not housed in a heat insulation case together with a cold storage material.

Means to Solve the Problem

An apparatus module according to the present disclosure is an apparatus module including: a rigid member disposed in an in-roof space between a roof panel and an interior member in a vehicle to be fixed to the roof panel; and an apparatus fixed to the rigid member, wherein the rigid member is provided with a heat receiving part having contact with the apparatus to receive heat from the apparatus and a heat radiation part radiating heat received by the heat receiving part, the heat receiving part and the heat radiation part are provided in positions away from each other in a surface of the rigid member, and heat is transferred from the heat receiving part to the heat radiation part via a heat transfer path connecting the heat receiving part and the heat radiation part in the rigid member.

Effects of the Invention

According to the present disclosure, measures against heat can be performed on an apparatus even when the apparatus is not housed in a heat insulation case together with a cold storage material.

BRIEF DESCRIPTION OF DRAWINGS

FIG. 3 is a plan view illustrating the apparatus module according to the embodiment 1.
FIG. 7 is a plan view illustrating an apparatus module according to an embodiment 3.

DESCRIPTION OF EMBODIMENT(S)

Description of Embodiment of Present Disclosure

Figure 1:
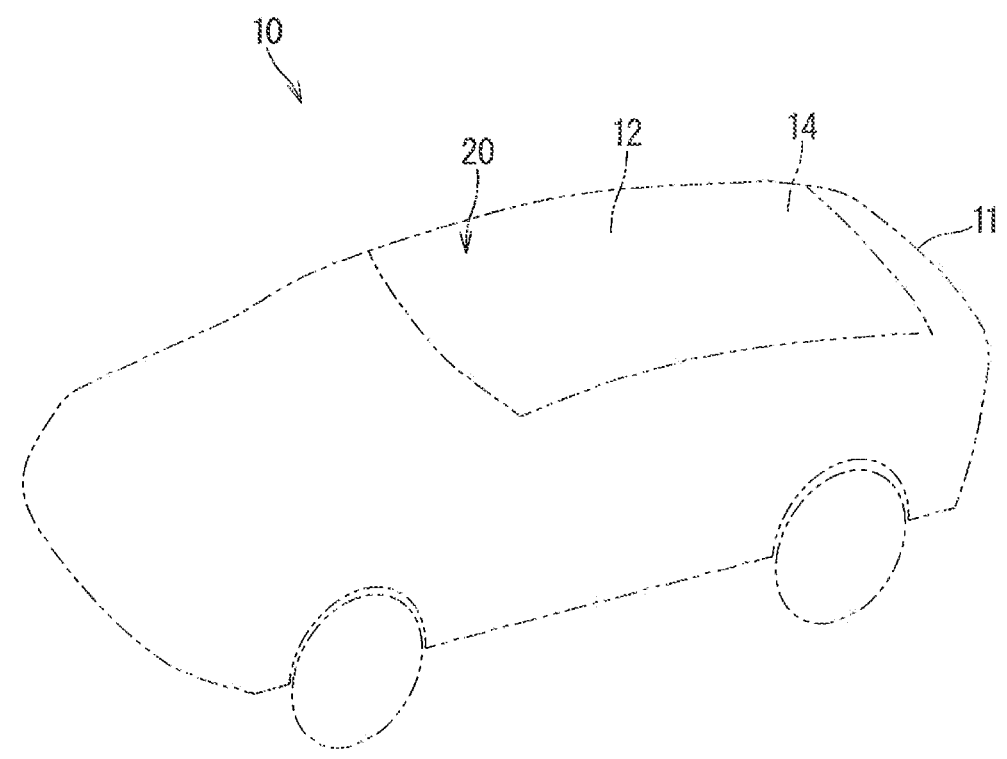
FIG. 1 is a schematic perspective view illustrating a vehicle into which an apparatus module is incorporated.

Embodiments of the present disclosure are listed and described firstly.

An apparatus module according to the present disclosure is as follows.

(1) An apparatus module includes: a rigid member disposed in an in-roof space between a roof panel and an interior member in a vehicle to be fixed to the roof panel; and an apparatus fixed to the rigid member, wherein the rigid member is provided with a heat receiving part having contact with the apparatus to receive heat from the apparatus and a heat radiation part radiating heat received by the heat receiving part, the heat receiving part and the heat radiation part are provided in positions away from each other in a surface of the rigid member, and heat is transferred from the heat receiving part to the heat radiation part via a heat transfer path connecting the heat receiving part and the heat radiation part in the rigid member. Heat of the apparatus is transferred from the heat receiving part to the heat radiation part via the heat transfer path, and is radiated via the heat radiation part. Accordingly, heat radiation properties of the apparatus can be increased, and measures against heat can be performed on the apparatus even when the apparatus is not housed in a beat insulation case together with a cold storage material.

(2) In the apparatus module according to (1), a heat transfer member having a higher heat transfer efficiency than a body part of the rigid member may be provided as a member constituting the heat transfer path. Accordingly, the heat transfer efficiency from the heat receiving part to the heat radiation part can be increased.

(3) In the apparatus module according to (2), the heat transfer member may include a heat pipe. Accordingly, heat of the apparatus can be transferred to the heat radiation part more efficiently by the heat pipe.

(4) In the apparatus module according to (2) or (3), at least a part of the heat transfer member may be provided inside the body part of the rigid member. Accordingly, suppressed is reduction in a region which can be used for attaching the apparatus radiating heat of the apparatus in a surface of the rigid member. Heat can also be transferred to a wide part of the rigid member other than the heat radiation part via the heat transfer member.

(5) The apparatus module according to any one of (1) to (4) may further include a heat conductive member intervening between a surface of the apparatus and a surface of the heat receiving part to fill a gap between the surface of the apparatus and the surface of the heat receiving part. Accordingly, interfacial thermal resistance between the apparatus and the heat receiving part is reduced by the heat conductive member, and heat of the apparatus can be further transferred to the heat receiving part more efficiently.

(6) In the apparatus module according to any one of (1) to (5), the heat radiation part may be provided to a surface of the rigid member directed to a side of the interior member. Accordingly, heat can be radiated to the side of the interior member having a low temperature when the in-roof space has a high temperature by influence of solar radiation.

(7) In the apparatus module according to any one of (1) to (6), the heat radiation part may be provided in a position facing a vent of a duct disposed in the in-roof space. Accordingly, cool air from the duct can be applied to the heat radiation part, and heat radiation properties are increased.

(8) The apparatus module according to any one of (1) to (7) may include a functional sheet provided with the rigid member. Accordingly, the functional sheet can be hanged and supported by the roof panel via the rigid member.

(9) In the apparatus module according to (8), it is applicable that the functional sheet includes a heat insulating layer and the heat radiation part is exposed to a side closer to the interior member in relation to the heat insulating layer. The heat insulating layer is provided, thus a temperature on the side closer to the interior member in relation to the heat insulating layer gets lower than that on a side closer to the roof panel in relation to the heat insulating layer easily. The heat radiation part is exposed to the side closer to the interior member in relation to the heat insulating layer, thus heat radiation properties of the heat radiation part is increased.

(10) The apparatus module according to (8) or (9) may include a transmission member provided to the functional sheet and connected to the apparatus. Accordingly, the transmission member can be hanged and supported by the roof panel via the rigid member.

Detailed Description of Embodiment of Present Disclosure

Specific examples of an apparatus module of the present disclosure are described hereinafter with reference to the drawings. The present disclosure is not limited to these examples, but is indicated by claims, and it is intended that meanings equivalent to claims and all modifications within a scope of claims are included.

Embodiment 1

Figure 2:
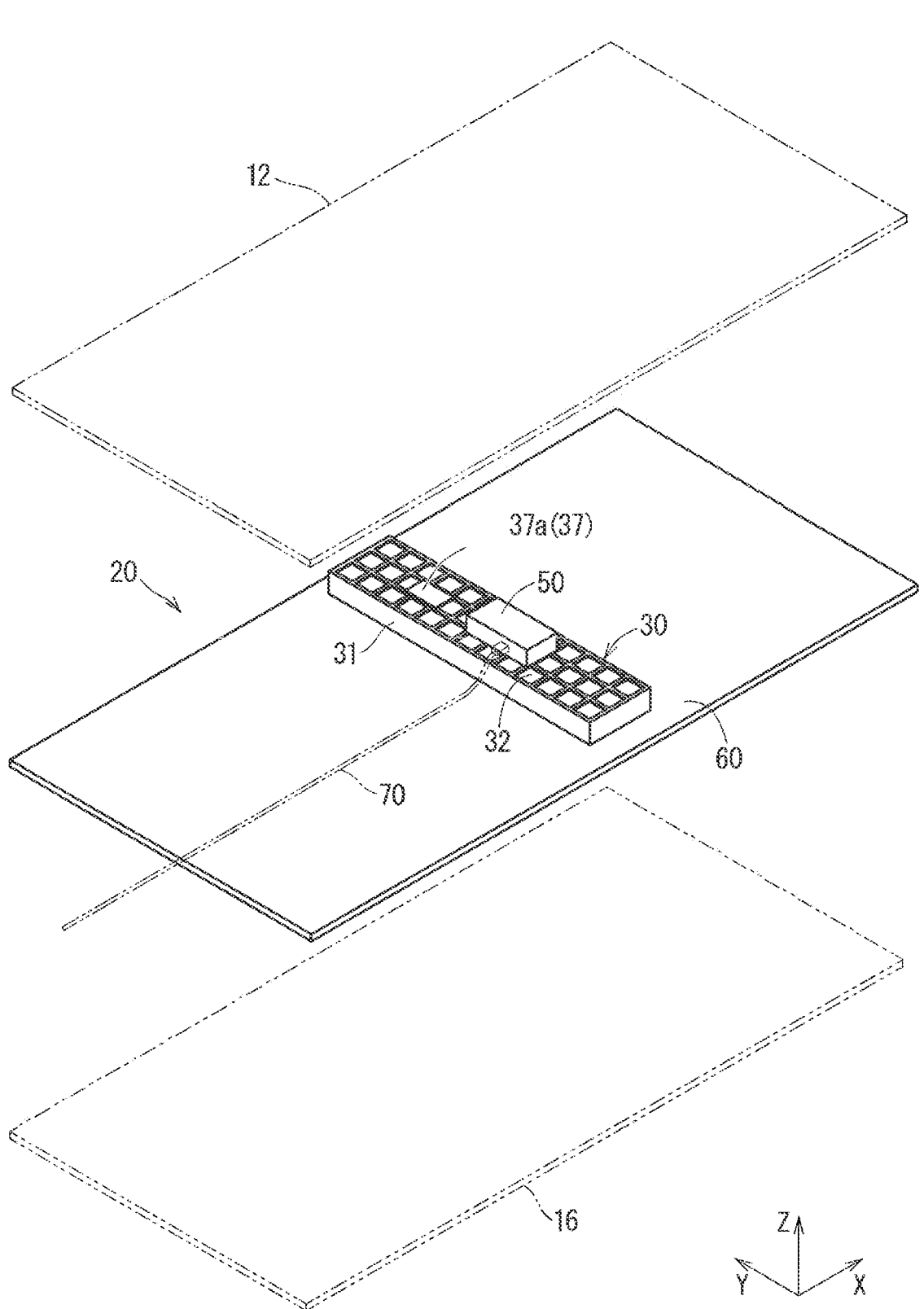
FIG. 2 is a perspective view illustrating the apparatus module according to the embodiment 1.

An apparatus module according to an embodiment 1 is described hereinafter.
<Vehicle into which Apparatus Module is Incorporated>
FIG. 1 is a schematic perspective view illustrating a vehicle 10 into which an apparatus module 20 is incorporated. The vehicle 10 includes a body 11. The body 11 is a part forming an outer shape of the vehicle 10. The body 11 may be a monocoque body or a body mounted on a ladder type frame. Herein, the body 11 includes a lateral panel surrounding a vehicle interior, a roof panel 12, a boarding door panel for a passenger to get in or out of a vehicle, and a rear door panel to take in and out a luggage, for example. The body 11 may be formed by metal or resin. The body 11 may also be made of a combination of metal and resin. A plate-like part of the body 11 covering an upper side of the vehicle interior constitutes the roof panel 12. That is to say, the roof panel 12 forms a roof part of the vehicle 10. The roof panel 12 may be partially or wholly curved to form an appearance shape of the body 11. The roof panel 12 may be formed by metal or resin. The roof panel 12 may also be made of a combination of metal and resin. An antenna hole may be formed in the roof panel 12.
<Position where Apparatus Module is Incorporated in Vehicle>
A position where the apparatus module 20 is incorporated is described with reference to FIG. 2. FIG. 2 is a perspective view illustrating the apparatus module 20 according to the embodiment 1. FIG. 2 illustrates an X direction, a Y direction, and a Z direction perpendicular to each other. In the present disclosure, the X direction is a front-back direction of the vehicle 10, the Y direction is a width direction of the vehicle 10, and the Z direction is a vertical direction in a state where the apparatus module 20 is disposed in the vehicle 10.

Figure 4:
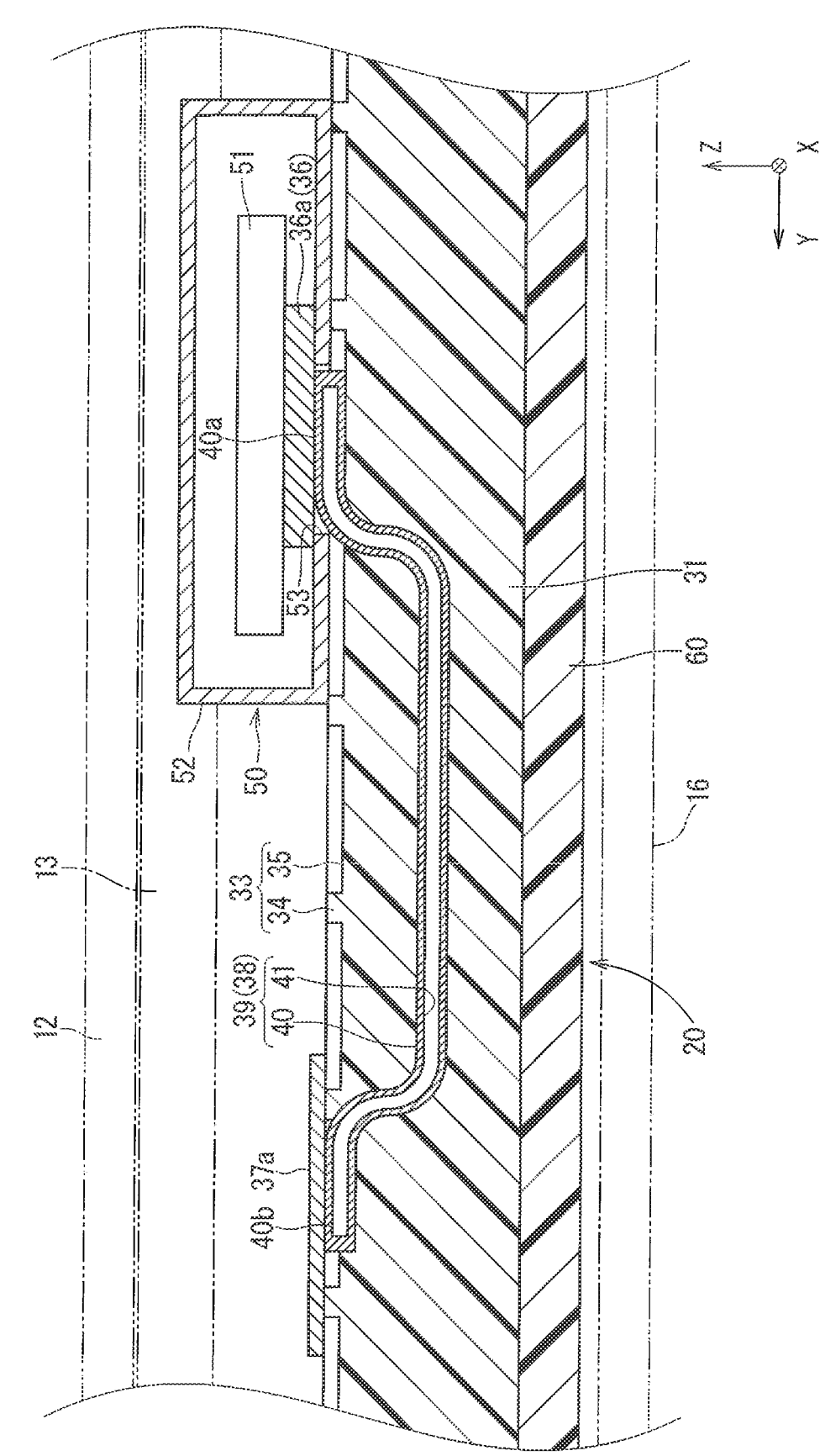
FIG. 4 is a cross-sectional view along a IV-IV line in FIG. 3.

The apparatus module 20 is incorporated into a roof part 14 including the roof panel 12. The roof panel 12 described above and an interior member 16 are illustrated as the roof part 14. The roof part 14 may include a frame 13 (refer to FIG. 4) supporting the roof panel 12 in some cases. The interior member 16 is a plate-like member formed of resin, for example. The interior member 16 is a part forming a ceiling shape of the vehicle interior. The interior member 16 may be partially or wholly curved. The interior member 16 is attached to a lower side of the roof panel 12. The interior member 16 is a part exposed to the vehicle interior. The interior member 16 is also referred to as a roof liner in some cases. The apparatus module 20 is disposed in an in-roof space. The in-roof space is a space between the roof panel 12 and the interior member 16 in the vehicle 10. The in-roof space is an in-vehicle space, and is a space which is not a space in which a passenger gets on a vehicle. The in-vehicle space is a space covered by the body 11 forming an outer appearance of the vehicle 10, and a space in which the passenger gets on the vehicle is a space covered by the interior member 16 forming an inner appearance of the vehicle 10.
<Apparatus Module>
The apparatus module 20 is described with reference to FIG. 3 and FIG. 4 in addition to FIG. 2. FIG. 3 is a plan view illustrating the apparatus module 20 according to the embodiment 1. FIG. 4 is a cross-sectional view of the apparatus module 20, and is a cross-sectional view along a IV-IV line in FIG. 3.

The apparatus module 20 includes a rigid member 30 and an apparatus 50. The apparatus module 20 further includes a functional sheet 60 and a transmission member 70.

The rigid member 30 is disposed in the in-roof space. The rigid member 30 is fixed to the roof panel 12. The apparatus 50 is fixed to the rigid member 30. The rigid member 30 is provided with a heat receiving part 36 and a heat radiation part 37. The heat receiving part 36 is a part having contact with the apparatus 50 to receive heat from the apparatus 50. The heat radiation part 37 is a part radiating the heat received by the heat receiving part 36. The heat receiving part 36 and the heat radiation part 37 are provided in positions in the surface of the rigid member 30 away from each other. The heat is transferred from the heat receiving part 36 to the heat radiation part 37 via a heat transfer path connecting the heat receiving part 36 and the heat radiation part 37 in the rigid member 30. Examples of general heat transfer include transfer by heat conduction, heat convection, and heat radiation. Assumed as the heat transfer in the heat transfer path described above are mainly the heat conduction and the heat convection.

The rigid member 30 includes a body part 31. The apparatus 50 is supported by a support surface 32 in a surface of the body part 31. In the present example, the support surface 32 is a vertically-upward surface. The support surface 32 may be a surface other than a vertically-upward surface. A concave-convex part 33 is provided to the support surface 32. A rib 34 is provided to the support surface 32 in a lattice form. A portion of the rib 34 serves as a convex part 34 in the concave-convex part 33, and a portion surrounded by the rib 34 serves as a concave part 35 in the concave-convex part 33. The apparatus 50 is supported on the convex part 34, and does not have contact with the concave part 35.

In the present example, a member different from the body part 31 is provided as the heat receiving part 36 and the heat radiation part 37. It is sufficient that the heat receiving part 36 and the heat radiation part 37 are members having a higher thermal conductivity (smaller thermal resistance) than the body part 31. Any combination of the body part 31, the heat receiving part 36, and the heat radiation part 37 can be appropriately set as long as it is a combination having thermal conductivities different from each other. The heat receiving part 36 and the heat radiation part 37 are preferably made of metal. For example, it is applicable that the body part 31 is made of resin and the heat receiving part 36 and the heat radiation part 37 are made of metal. For example, it is applicable that the body part 31 is made of metal having a low thermal conductivity and the heat receiving part 36 and the heat radiation part 37 are made of metal having a high thermal conductivity. In the example illustrated in FIG. 4, a heat receiving plate 36a is provided as the heat receiving part 36, and a heat radiation plate 37a is provided as the heat radiation part 37. The heat receiving plate 36a and the beat radiation plate 37a may be metal plates, for example. The heat radiation part 37 may be a heatsink. A surface area of the heat radiation part 37 may be increased by integrally providing a rib and a fin with the heat radiation plate 37a.

The rigid member 30 is provided with a heat transfer member 38 as a member constituting the heat transfer path. The heat transfer member 38 has higher thermal transfer efficiency (referred to as heat conduction efficiency hereinafter) than the body part 31. The body part 31 transfers the heat mainly by heat conduction. The heat conduction efficiency of the heat transfer member 38 is higher than that of the body part 31 by the heat conduction.

Herein, the heat transfer member 38 includes a heat pipe 39. The heat pipe 39 circulates an operation liquid while performing phase-change thereon, thereby transferring the heat more efficiently than the heat conduction. Accordingly, the heat conduction efficiency of the heat pipe 39 is higher than that of the body part 31 by the heat conduction.

The heat pipe 39 includes a container 40. The container 40 is a hollow member. The operation liquid (not shown) is enclosed within the container 40. It is sufficient that an inner space of the container 40 is filled with saturation vapor of the operation liquid. It is sufficient that the inner space of the container 40 is depressurized so that the operation liquid easily boils. In the example illustrated in FIG. 4, the heat pipe 39 is a non-loop type pipe. The container 40 includes a first end portion 40a and a second end portion 40b. The first end portion 40a is thermally connected to the heat receiving part 36, and the second end portion 40b is thermally connected to the heat radiation part 37. The first end portion 40a and the second end portion 40b can be connected to the heat receiving plate 36a and the heat radiation plate 37a, respectively, by an optional connection form. For example, it is applicable that the first end portion 40a is welded to the heat receiving plate 36a and the second end portion 40b is welded to the heat radiation plate 37a. The operation liquid located in the first end portion 40a receives the heat from the heat receiving part 36 and is evaporated to be vapor. At this time, the operation liquid absorbs latent heat. The vapor moves in the container 40 toward the second end portion 40b. In the second end portion 40b, the vapor passes the heat to the heat radiation part 37 and becomes compacted to returned to be liquid. At this time, the operation liquid discharges latent heat. The operation liquid returning to be liquid moves in the container 40 toward the first end portion 40a. Subsequently, this cycle is repeated, and a difference of temperature between the first end portion 40a and the second end portion 40b is reduced.

A cavity 41 is provided to the inner space of the container 40. The vapor moves in the cavity 41 from the first end portion 40a toward the second end portion 40b. The vapor moves using a difference between density (difference in atmospheric pressure) between the first end portion 40a and the second end portion 40b. The vapor can also move from a vertically-lower side to a vertically-upper side from the first end portion 40a toward the second end portion 40b. A wick in which liquid moves may be provided to the inner space of the container 40. The wick is normally provided to an inner surface of the container 40 to surround the cavity 41. An inner surface of the wick faces the cavity 41. The wick is a member in which a capillary tube is formed. The operation liquid can also move from the vertically-lower side to the vertically-upper side from the second end portion 40b toward the first end portion 40a by using a so-called capillary action. The wick may not be provided in a case where the liquid always moves vertically downward from the second end portion 40b toward the first end portion 40a.

A type of each of the container 40, the operation liquid, and the wick in the heat pipe 39 is not particularly limited, however, various types of container 40, operation liquid, and wick can be used. The container 40 may be made of resin or metal, for example. Water or alcohol, for example, may be used as the operation liquid. The wick may be a mesh or a wire provided separately from the container 40, for example. The wick may be a groove part formed in the inner surface of the container 40. The wick may be a porous member such as sintered metal. The container 40 supplies and receives the heat by the heat receiving part 36, the heat radiation part 37, and the operation liquid and mainly heat conduction. Accordingly, the container 40 is preferably made of metal having a high thermal conductivity. In the similar manner, the wick provided separately from the container 40 is also preferably made of metal having a high thermal conductivity. When the container 40 and the wick are provided separately from each other, a material of the container 40 and a material of the wick may be the same type or types different from each other.

The heat pipe may be a so-called loop heat pipe in which a container is formed in a loop form. In the roof heat pipe, a part of a section of a loop-like container is thermally connected to the heat receiving part 36, and the other part of the section is thermally connected to the heat radiation part 37. The heat pipe may be a so-called self-induced vibration beat type in which a container is formed into an accordionlike shape repetitively passing between the heat receiving part 36 and the heat radiation part 37.

At least a part of the heat transfer member 38 is provided to an inner part of the body part 31. Herein, an intermediate part of the heat pipe 39 is provided to the inner part of the body part 31. Both end portions of the heat pipe 39 protrude to an outer part of the body part 31. The body part 31 may be insert-molded using the heat transfer member 38 as an insert component. In this case, saved are time and labor to assemble the heat transfer member 38 to the body part 31 later, and path retention of the heat transfer member 38 is increased. The heat transfer member 38 may be attached to the body part 31 after molding the body part 31. In this case, it is sufficient that a path (hollow space) for passing the heat transfer member 38 is provided to the inner part of the body part 31 at the time of molding the body part 31. In this case, the heat transfer member 38 is detachable, and the heat transfer member 38 can be changed without changing the body part 31 in accordance with change of the apparatus 50, for example.

The apparatus 50 is supported by the support surface 32 of the rigid member 30. The apparatus 50 is an electrical apparatus including an electrical circuit, for example. The apparatus 50 is a communication apparatus for communication with an external apparatus, for example. In the present example, the apparatus 50 is disposed closer to a side of the roof panel 12 in relation to the rigid member 30 along the Z direction. The apparatus 50 is disposed closer to the side of the roof panel 12 in relation to the functional sheet 60 along the Z direction. The apparatus 50 includes an apparatus body 51 and a casing 52. The apparatus body 51 includes a circuit substrate and an electrical component, for example. The apparatus body 51 is housed in the casing 52. A surface of the casing 52 has contact with the support surface 32. The casing 52 may be formed by resin. The casing 52 may be formed by metal. The casing 52 may be a composite member including a portion made of resin and a portion made of metal.

A through hole 53 is formed in the casing 52. The apparatus body 51 and the heat receiving part 36 have contact with each other through the through hole 53. Herein, the heat receiving plate 36a is disposed in an inner part of the casing 52 through the through hole 53. Herein, a part of the surface of the casing 52 with no through hole 53 has contact with a convex part 34 of the support surface 32. A portion where the casing 52 and the convex part 34 have contact with each other may surround four sides of the through hole 53 when seen from the Z direction while the casing 52 has contact with the convex part 34. An opening part of the through hole 53 may be closed by the body part 31.

The functional sheet 60 is a member provided separately from the interior member 16. The rigid member 30 is disposed on the functional sheet 60. A surface of the rigid member 30 different from the support surface 32 has contact with the functional sheet 60. The rigid member 30 and the transmission member 70 are fixed to the functional sheet 60. The functional sheet 60 is a sheet to which these members are fixed, and also is a sheet including a layer having at least one function of a heat insulation function, an acoustic insulation function, and a radio wave shielding function. In the present example, the functional sheet 60 includes a layer having at least the heat insulation function.

For example, a non-woven layer can be used as a layer having the heat insulation function. The non-woven layer is an example of a layer having heat insulation properties suppressing heat transmission between one main surface and the other main surface of the functional sheet 60. The heat insulating layer may be a layer reflecting heat radiation energy. The heat insulating layer may be a layer having a lower thermal conductivity than the other layer. For example, a sheet including minute spaces such as a non-woven sheet or a foam sheet, for example, may be used for the heat insulating layer. A heat insulating coating or a heat shielding coating may be used as the heat insulating layer.

The non-woven layer can also be grasped as an example of a layer having acoustic insulation properties suppressing acoustic transmission between one main surface and the other main surface of the functional sheet 60. The layer having the acoustic insulating properties may reflect sound or absorb energy of sound as heat energy. For example, a sheet including minute spaces such as a non-woven sheet or a foam sheet, for example, may be used as an acoustic insulating layer. A sound absorbing coating may be used as the acoustic insulating layer. The heat insulating layer and the acoustic insulating layer may be provided as physically different layers.

The functional sheet 60 may have a single-layer structure. The functional sheet 60 may have a multilayer structure. For example, the non-woven layer described above and a radio wave shielding layer may be stacked in the functional sheet 60.

The radio wave shielding layer is a layer suppressing radio wave transmission between one main surface and the other main surface of the functional sheet 60. The radio wave shielding layer may have radio wave shielding properties on all of frequencies. The radio wave shielding layer may have selective radio wave shielding properties on some frequency band. In this case, it is sufficient that at least one of reflection and absorption of radio wave of some frequency band is performed in the radio wave shielding layer. The radio wave shielding layer may be a layer formed of a metal foil such as aluminum or iron. A known frequency selective surface (FSS) may be used as the radio wave shielding layer having the selective radio wave shielding properties. The frequency selective film has a configuration that a unit cell (element) is formed by a metal foil on a base film formed of resin, for example. Such a frequency selective surface has characteristics of selectively shielding radio wave of one or a plurality of frequency bands in accordance with frequency characteristics of the unit cell (element), and passing radio wave of the other frequency band. The radio wave shielding layer having the selective radio wave shielding properties may also be formed by directly printing a conductive paste on a heat insulating layer or an acoustic insulation layer, for example.

An order of overlapping each functional layer is optionally set when the functional sheet 60 has a multilayer structure. For example, it is applicable that the radio wave shielding layer is provided on an upper side or a lower side of the non-woven layer in the functional sheet 60. A size of each functional layer is optionally set. Each functional layer may be formed to have the same size. The other functional layer may be partially provided on one functional layer. Each functional layer may be simply overlapped with each other. Each functional layer may be fixed to each other by a double-sided tape, an adhesive agent, or welding, for example.

Furthermore, in a case where the functional sheet 60 includes a plurality of functional layers, it is not necessary to arrange the plurality of functional layers to be overlapped in a thickness direction of the functional sheet 60. The plurality of functional layers may be provided in different regions in a region where the functional sheet 60 extends.

For example, the plurality of functional layers may be provided side by side in a region where the functional sheet 60 extends.

The transmission member 70 is connected to the apparatus 50. The transmission member 70 is a member transmitting electrical power or light, for example, and is a member in which at least one end thereof is provided along a wiring route connected to the apparatus 50 in the functional sheet 60. For example, the transmission member 70 may be a general wire having a core wire and a covering around the core wire, or may also be a bare conductive wire, a shielded wire, an electrical cable, an enamel wire, a nichrome wire, a coaxial wire, or an optical fiber. That is to say, the transmission member 70 may be a wire-like member transmitting electrical power. The wire-like member transmitting the electrical power may be various kinds of signal lines or various kinds of power lines. The wire-like transmission member 70 transmitting the electrical power may be a single wire-like object or a composite object of a plurality of wire-like objects (a twisted wire and a cable made up of a plurality of collected wire-like objects covered by a sheath, for example). The transmission member 70 may be formed by applying a conductive coating on the functional sheet 60 and etching on a copper foil, for example. Description herein is based on an assumption that the transmission member 70 is an electrical wire.

The apparatus 50 transmits or receives an electrical signal or an optical signal via the transmission member 70. Alternatively, the apparatus 50 receives a power supply or distributes electrical power via the transmission member 70. The transmission member 70 and the apparatus 50 may be connected to each other via a connector. It is also applicable that the transmission member 70 is directly introduced in the apparatus 50 to be directly connected to an electrical element in the apparatus 50. The transmission member 70 illustrated in FIG. 2 and FIG. 3 indicates a schematic route, thus there may be a case where the transmission member 70 includes a plurality of electrical wires even when it is illustrated as a single wire.

The transmission member 70 is provided to the functional sheet 60. Herein, a state where the transmission member 70 is provided to the functional sheet 60 indicates that a medium transmitting electrical power or light is formed to constitute an electrical or optical route on the functional sheet 60. Thus, the transmission member 70 provided to the functional sheet 60 includes the transmission member 70 directly formed by applying a conductive coating to the functional sheet 60 and etching on a copper foil and the transmission member 70 in which the wire-like transmission member 70 manufactured separately from the functional sheet 60 is attached to form a constant route along one of or both main surfaces of the functional sheet 60. A specific configuration for supporting the transmission member 70 is not particularly limited.

For example, the transmission member 70 may be fixed to one main surface of the functional sheet 60. For example, the transmission member 70 may be welded (or fused) to one main surface of the functional sheet 60. A welding part thereby formed has a configuration that a part of at least one of the transmission member 70 and/or the functional sheet 60 is melted and adheres to the other side member. The transmission member 70 and the functional sheet 60 may be welded by ultrasonic welding or thermal welding. It is also applicable that a surface of at least one of the transmission member 70 and the functional sheet 60 is melted by a solvent to weld the transmission member 70 and the functional sheet 60. For example, the transmission member 70 may be fixed to the functional sheet 60 by an adhesive agent or a double-sided tape, for example. For example, the transmission member 70 may be sewn to the functional sheet 60 by a sewing thread. It is also applicable that an adhesive tape is attached to a portion from an outer side of one main surface of the functional sheet 60 to the transmission member 70 in a state where the transmission member 70 is disposed on one main surface of the functional sheet 60 to fix the transmission member 70 to one main surface of the functional sheet 60, for example. The transmission member 70 needs not be fixed to only one main surface of the functional sheet 60. The transmission member 70 may include both a part fixed to one main surface of the functional sheet 60 and a part fixed to the other main surface of the functional sheet 60. In this case, the transmission member 70 may be provided to pass from one main surface toward the other main surface in an intermediate portion or an end edge portion of the functional sheet 60.

For example, the transmission member 70 may be sandwiched between two sheets, thereby being fixed to the functional sheet 60. For example, in a case where the functional sheet 60 includes a plurality of layers, the transmission member 70 may be sandwiched between sheets constituting each layer. In a case where the other sheet overlaps with the functional sheet 60, the transmission member 70 may be sandwiched between the functional sheet 60 and the other sheet. In this case, the two sheets sandwiching the transmission member 70 may be fixed by welding, or may also be fixed by an adhesive agent or a double-sided tape.

Herein, the transmission member 70 is provided on a surface of the functional sheet 60 on a side of the roof panel 12. The transmission member 70 may be provided on a surface of the functional sheet 60 on a side of the interior member 16.

The rigid member 30 is provided to the functional sheet 60. The rigid member 30 may have a function of providing deformation resistance to the functional sheet 60 in addition to a function of supporting the apparatus 50 and a function of flowing cooling air. The rigid member 30 preferably has higher rigidity than the functional sheet 60. A degree of rigidity herein may be evaluated by bending rigidity on a reference surface, which is a surface perpendicular to a longitudinal direction of the rigid member 30, of the rigid member 30 and bending rigidity on the reference surface in a partial region in the functional sheet 60 where the rigid member 30 is provided. For example, the functional sheet 60 may be a stacked body of an aluminum foil (radio wave shielding layer) and a non-woven cloth (heat insulating layer and acoustic insulation layer), and the rigid member 30 may be made of relatively hard resin (for example, polypropylene (PP) or polyamide (PA)). The rigid member 30 may have the concave-convex part 33 caused by the rib 34 described above and a honey comb structure to achieve weight saving while having strength. The rigid member 30 may be formed by metal such as iron or aluminum, for example. The rigid member 30 may be a composite member including a portion made of resin and a portion made of metal.

An arrangement region of the rigid member 30 in the in-roof space, that is to say, an arrangement region of the rigid member 30 on the functional sheet 60 is optionally set. The rigid member 30 may be provided in accordance with the arrangement region of the apparatus 50, for example. For example, when the apparatus 50 is an external communication antenna unit, the apparatus 50 is disposed in a position corresponding to an antenna hole formed in the roof panel 12. Accordingly, the rigid member 30 is preferably disposed below the antenna hole formed in the roof panel 12. The rigid member 30 may be provided in a position corresponding to the frame 13 in the roof part 14.

The rigid member 30 is fixed to the functional sheet 60 by an adhesive agent, a gluing agent, a double-sided tape, or welding (ultrasonic welding or thermal welding), for example. The rigid member 30 may be fixed to the functional sheet 60 with a screw or a pin, for example. Herein, the rigid member 30 is formed into an elongated rectangular shape. A length dimension of the rigid member 30 is set to be substantially the same as a width dimension of the functional sheet 60. The length dimension of the rigid member 30 may be smaller than the width dimension of the functional sheet 60 as long as an edge of the functional sheet 60 does not hang immediately downward (for example, smaller within a range of 20 cm or less). The rigid member 30 is disposed on the surface of the functional sheet 60 on the side of the roof panel 12. Facing surfaces thereof are bonded by an adhesive agent, for example.

The length direction of the rigid member 30 follows the width direction of the functional sheet 60. Thus, a part of the functional sheet 60 provided with the rigid member 30 is kept in a state of hardly hanging downward in the width direction. The arrangement region of the rigid member 30 on the functional sheet 60 is optionally set. The rigid member 30 may be provided on a partial region in the functional sheet 60.

The rigid member 30 may include a roof fixing part 42 fixed to the roof part 14. The roof fixing part 42 may be fixed to the roof panel 12 or the frame 13 supporting the roof panel 12 in the roof part 14. Accordingly, the apparatus 50, the functional sheet 60, and the transmission member 70 can be hanged and supported by the roof panel 12 or the frame 13 supporting the roof panel 12 via the rigid member 30. Accordingly, suppressed is load of the apparatus module 20 wholly applied on the interior member 16.

Any fixing state may be applied as a fixing state of fixing the roof fixing part 42 and the roof part 14. For example, the roof fixing part 42 and the roof part 14 may be fixed with a screw or a pin. For example, the roof fixing part 42 and the roof part 14 may be fixed by an adhesive agent, a gluing agent, a double-sided tape, or welding (ultrasonic welding or thermal welding), for example.

The in-roof space may include an apparatus provided in a position where the rigid member 30 is not located in addition to the apparatus 50 described above provided to the rigid member 30. Such an apparatus may be provided to the roof panel 12 or the frame 13 in the roof part 14 or the interior member 16, or may also be provided to the functional sheet 60. The transmission member 70 for the apparatus provided in the position where the rigid member 30 is not provided may be provided to the roof panel 12 or the frame 13 in the roof part 14 or the interior member 16, or may also be provided to the functional sheet 60.

The functional sheet 60 is incorporated into the roof part 14 to planarly extend over the roof panel 12 and the interior member 16. For example, the functional sheet 60 may be disposed to cover 80% or more of an area of the roof part 14. For example, the functional sheet 60 may be disposed to extend over a whole upper side of head rests of a plurality of passenger seats in the vehicle. When the functional sheet 60 is disposed over the roof part 14, the function of the functional sheet 60 can be performed on a region in the roof part 14 as large as possible. The transmission member 70 and the apparatus 50 disposed in the in-roof space can be supported in the region in the roof part 14 as large as possible.

<Effect Etc.>

According to the apparatus module 20 having the above configuration, the heat of the apparatus 50 is transferred from the heat receiving part 36 to the heat radiation part 37 via the heat transfer path, and is radiated via the heat radiation part 37. Accordingly, the heat radiation properties of the apparatus 50 can be increased, and measures against the heat can be performed on the apparatus 50 even when the apparatus 50 is not housed in a heat insulation case together with a cold storage material.

The heat transfer member 38 having the higher thermal transfer efficiency than the body part 31 is provided as the member constituting the heat transfer path. Accordingly, the heat transfer efficiency from the heat receiving part 36 to the heat radiation part 37 can be increased.

The heat transfer member 38 includes the heat pipe 39. The heat pipe 39 can transfer the heat more efficiently than the heat conduction. Accordingly, the heat of the apparatus 50 can be transferred to the heat radiation part 37 more efficiently by the heat pipe 39.

At least a part of the heat transfer member 38 is provided to the inner part of the body part 31. Accordingly, suppressed is reduction in the region which can be used for attaching the apparatus 50 in the surface of the rigid member 30. The heat can also be transferred to the wide part of the rigid member 30 other than the heat radiation part 37 via the heat transfer member 38.

The apparatus module 20 includes the functional sheet 60 provided with the rigid member 30. Accordingly, the functional sheet 60 can be hanged and supported by the roof panel 12 via the rigid member 30.

The apparatus module 20 includes the transmission member 70 extending from the apparatus 50 to be provided to the functional sheet 60. Accordingly, the transmission member 70 can be hanged and supported by the roof panel 12 via the rigid member 30.

Embodiment 2

Figure 5:
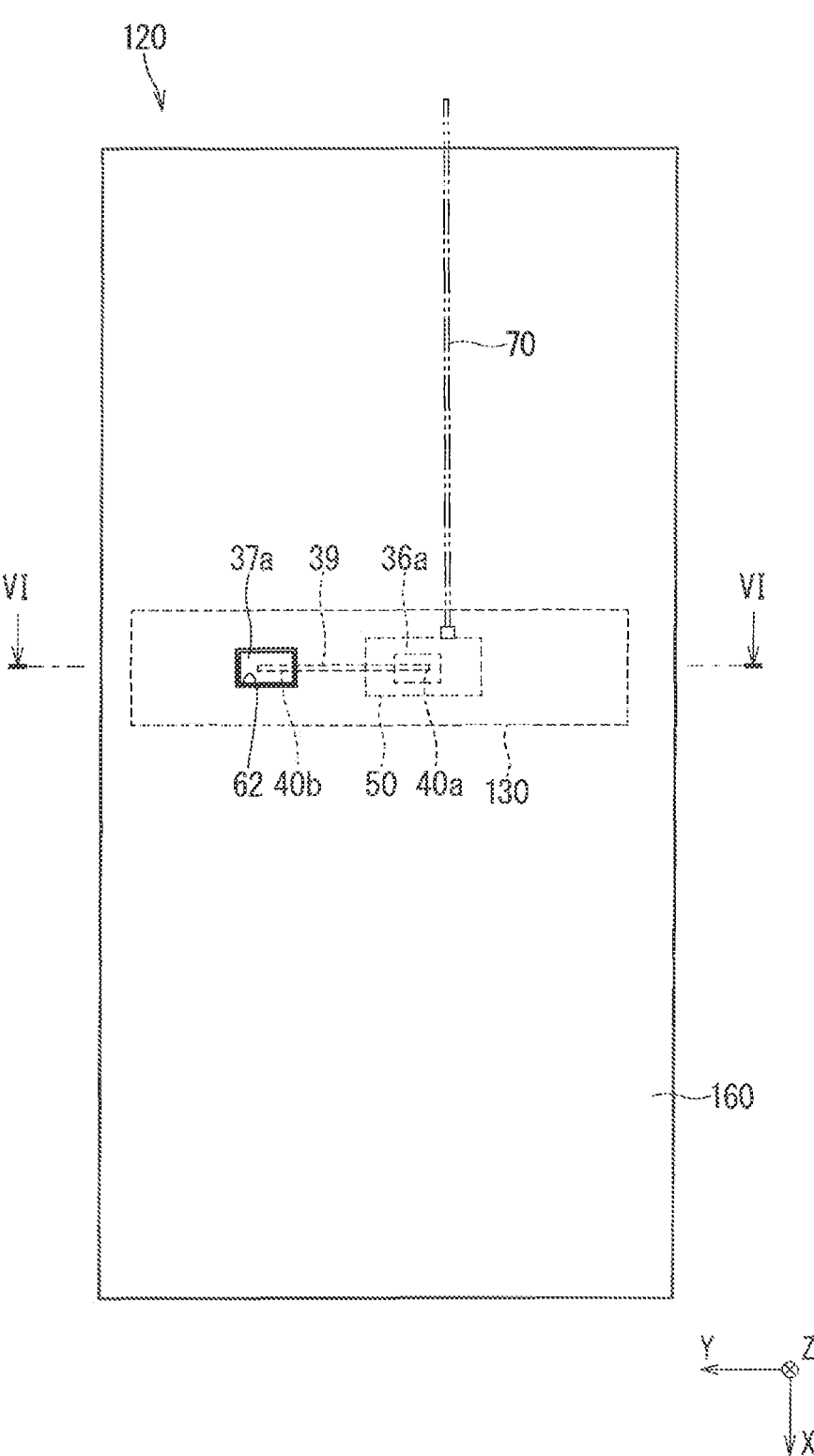
FIG. 5 is a bottom view illustrating an apparatus module according to an embodiment 2.
Figure 6:
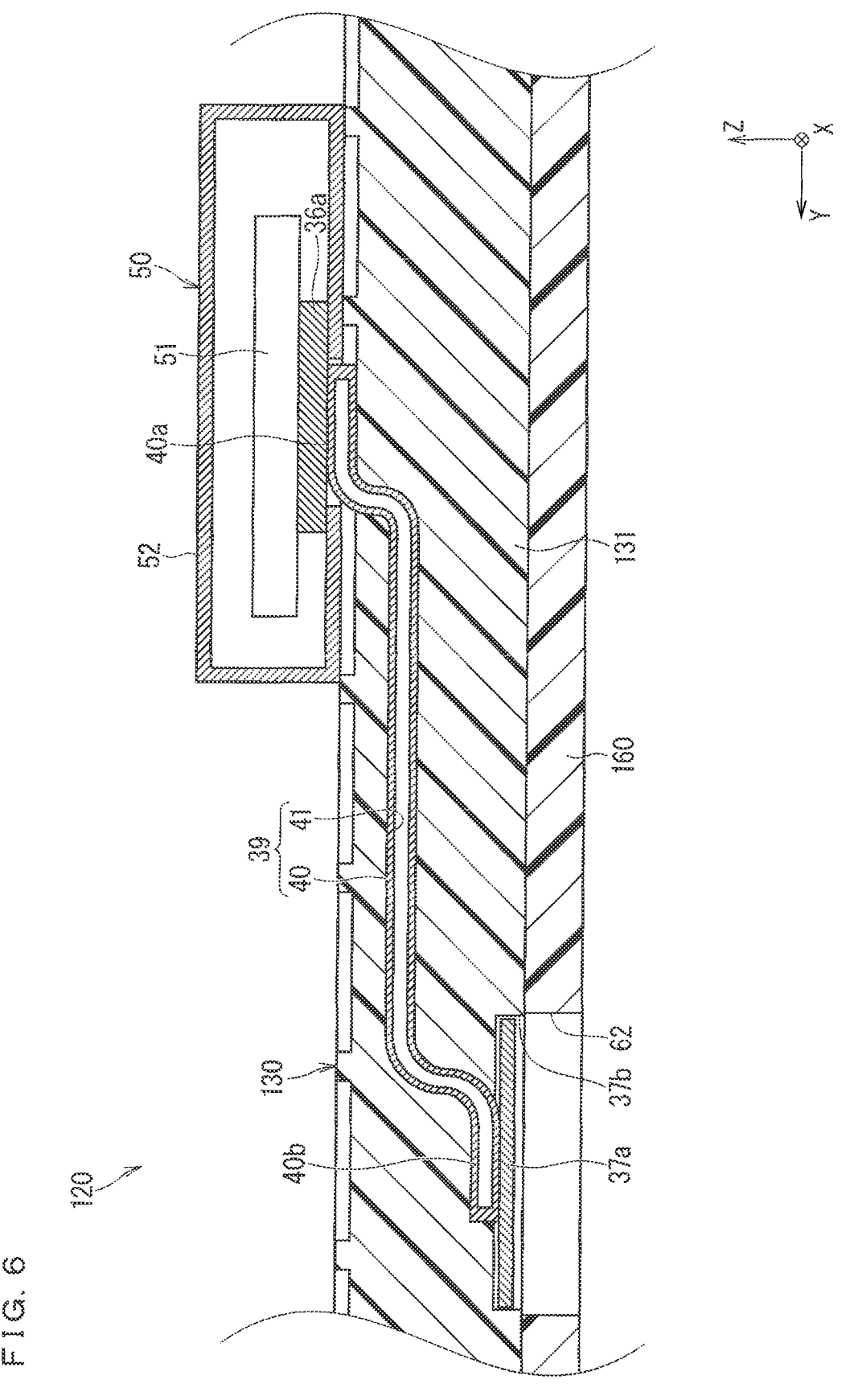
FIG. 6 is a cross-sectional view along a VI-VI line in FIG. 5.

An apparatus module according to an embodiment 2 is described. FIG. 5 is a bottom view illustrating an apparatus module 120 according to the embodiment 2. FIG. 6 is a cross-sectional view along a VI-VI line in FIG. 5. In the following description of the present embodiment, the same reference numerals are assigned to the similar constituent elements described above, and the description thereof will be omitted. The same applies to the description of each embodiment and modification example hereinafter.

In the apparatus module 120, the heat radiation part 37 is provided to a surface of a rigid member 130 directed to a side of the interior member 16. Accordingly, the heat can be radiated to the side of the interior member 16 having a low temperature when the in-roof space has a high temperature by influence of solar radiation. In the example illustrated in FIG. 6, a housing concave part 37*b* is formed in a surface of a body part 131 of the rigid member 130 directed to the side of the interior member 16. The housing concave part 37*b* is formed to have a size corresponding to the heat radiation plate 37*a*. The heat radiation plate 37*a* is housed in the housing concave part 37*b*. Accordingly, suppressed is protrusion of the heat radiation plate 37*a* on a lower side of the body part 131. However, the housing concave part 37*b* may not be formed in the body part 131. The heat radiation plate 37*a* may protrude on the lower side of the body part 131.

The second end portion 40*b* of the container 40 is provided to a surface (lower surface herein) of the body part 131 directed to a side opposite to a surface (upper surface herein)

thereof in which the first end portion 40*a* is provided. The container 40 passes through the body part 131 in an up-down direction. In a bottom view in FIG. 5, the second end portion 40*b* is provided in a position different from the first end portion 40*a*. An intermediate part of the container 40 horizontally extends with a height different from the first end portion 40*a* and the second end portion 40*b* (height lower than the first end portion 40*a* and higher than the second end portion 40*b*) between the first end portion 40*a* and the second end portion 40*b*. The intermediate part of the container 40 may horizontally extend with the same height as the first end portion 40*a*, or may also horizontally extend with the same height as the second end portion 40*b*. In a bottom view in FIG. 5, the second end portion 40*b* is provided in the same position as the first end portion 40*a*. In this case, it is also applicable that the intermediate part of the container 40 does not extend in a horizontal direction but extend only in a vertical direction.

In the apparatus module 120, a functional sheet 160 includes a heat insulating layer, and the heat radiation part 37 is exposed closer to the side of the interior member 16 in relation to the heat insulation layer. The heat insulating layer is provided, thus even when the in-roof space has a high temperature by influence of solar radiation, a temperature on the side closer to the interior member 16 in relation to the heat insulating layer gets lower than that on a side closer to the roof panel 12 in relation to the heat insulating layer easily. The heat radiation part 37 is exposed to the side closer to the interior member 16 in relation to the heat insulating layer, thus heat radiation properties of the heat radiation part 37 is increased. When the functional sheet 160 is provided to the side closer to the interior member 16 in relation to the rigid member 130, as illustrated in FIG. 6 as an example, it is also applicable that a window part 62 exposing the heat radiation part 37 to the functional sheet 160 is provided, and the heat radiation part 37 is exposed to the side closer to the interior member 16 in relation to the heat insulation layer through the window part 62. It is also applicable that a window part is also provided to the interior member 16 and the heat radiation part 37 is exposed to the inner side of the vehicle. The interior member 16 may not be provided with the window part.

Embodiment 3

Figure 8:
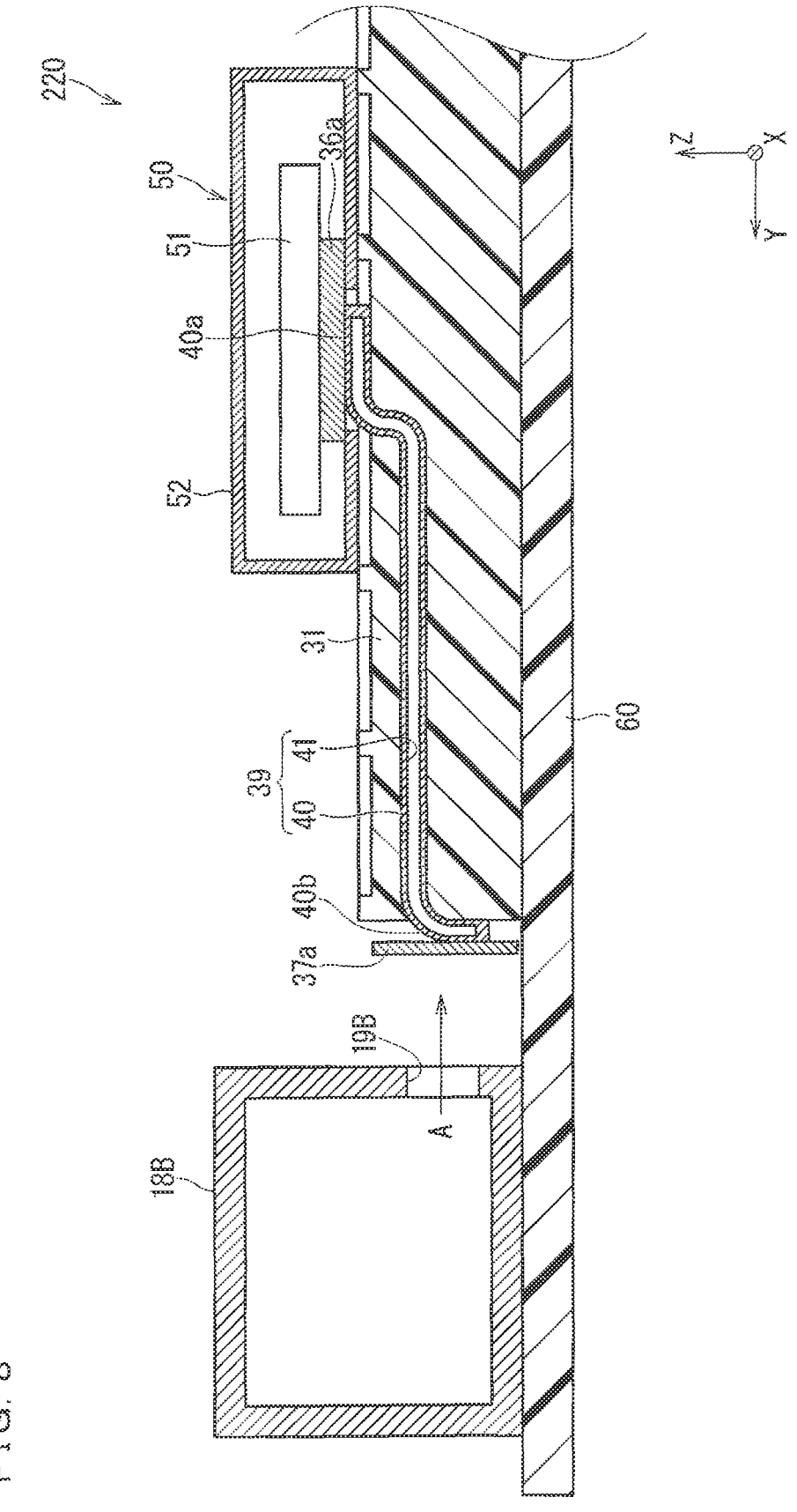
FIG. 8 is a cross-sectional view along a VIII-VIII line in FIG. 7.

An apparatus module according to an embodiment 3 is described. FIG. 7 is a plan view illustrating an apparatus module 220 according to the embodiment 3. FIG. 8 is a cross-sectional view along a VIII-VIII line in FIG. 7.

In the present example, a duct 17 is disposed in the in-roof space. The duct 17 in the present example is the duct 17 for a rear seat. The duct 17 includes flow paths 18A, 18B, and 18C. The flow paths 18A and 18B extend in the X direction on both sides of the vehicle 10. The flow path 18C extends in the Y direction on a rear side of the vehicle 10 to connect the flow paths 18A and 18B. The duct 17 is provided with a vent 19A (refer to FIG. 3) of air toward the rear seat. The vent 19A is provided to the flow paths 18A and 18B, for example. In the vehicle 10, a body of an air conditioning device such as an air conditioner unit is not normally disposed in the in-roof space but is disposed in a lower side of the in-roof space (for example, inside of an installment panel or back side of the rear seat). The duct 17 for the rear seat is connected to the body of the air conditioning device disposed on a back side of the rear seat via a duct passing through a C pillar, for example. Cool air from the body of the air conditioning device is discharged toward the rear seat via the vent 19A. The flow path 18B is provided with a vent 19B of air toward the rigid member 30 in addition to the vent 19A of air toward the rear seat. The vent 19B is opened to the in-roof space. The vent 19B is provided in a position facing a side surface of the body part 31.

The heat radiation part 37 is provided in a position facing the vent 19B of the duct 17 disposed in the in-roof space. Accordingly, as illustrated by an arrow A in FIG. 8, cool air from the duct 17 can be applied to the heat radiation part 37, and heat radiation properties are increased. Herein, the heat radiation plate 37*a* and the second end portion 40*b* of the heat pipe 39 are provided to the side surface of the body part 31. It is also applicable that the second end portion 40*b* of the heat pipe 39 is provided to an upper surface or a lower surface of the body part 31, and the heat radiation plate 37*a* is provided to have an L-like shape to cover the upper surface or the lower surface and the side surface of the body part 31. It is also applicable that a housing concave part similar to the housing concave part 37*b* according to the embodiment 2 is formed in the side surface of the body part 31, and the heat radiation plate 37*a* and the second end portion 40*b* of the heat pipe 39 are provided inside the housing concave part. The housing concave part may be a hole with a bottom opened to only the side surface, or may also be a through hole passing through the body part 31.

Cool air from a duct for a front seat may be applied to the heat radiation part 37. When the duct for the front seat is located in a position away from the heat radiation part 37, a tubular member connected to the duct may extend to the heat radiation part 37.

Embodiment 4

Figure 9:
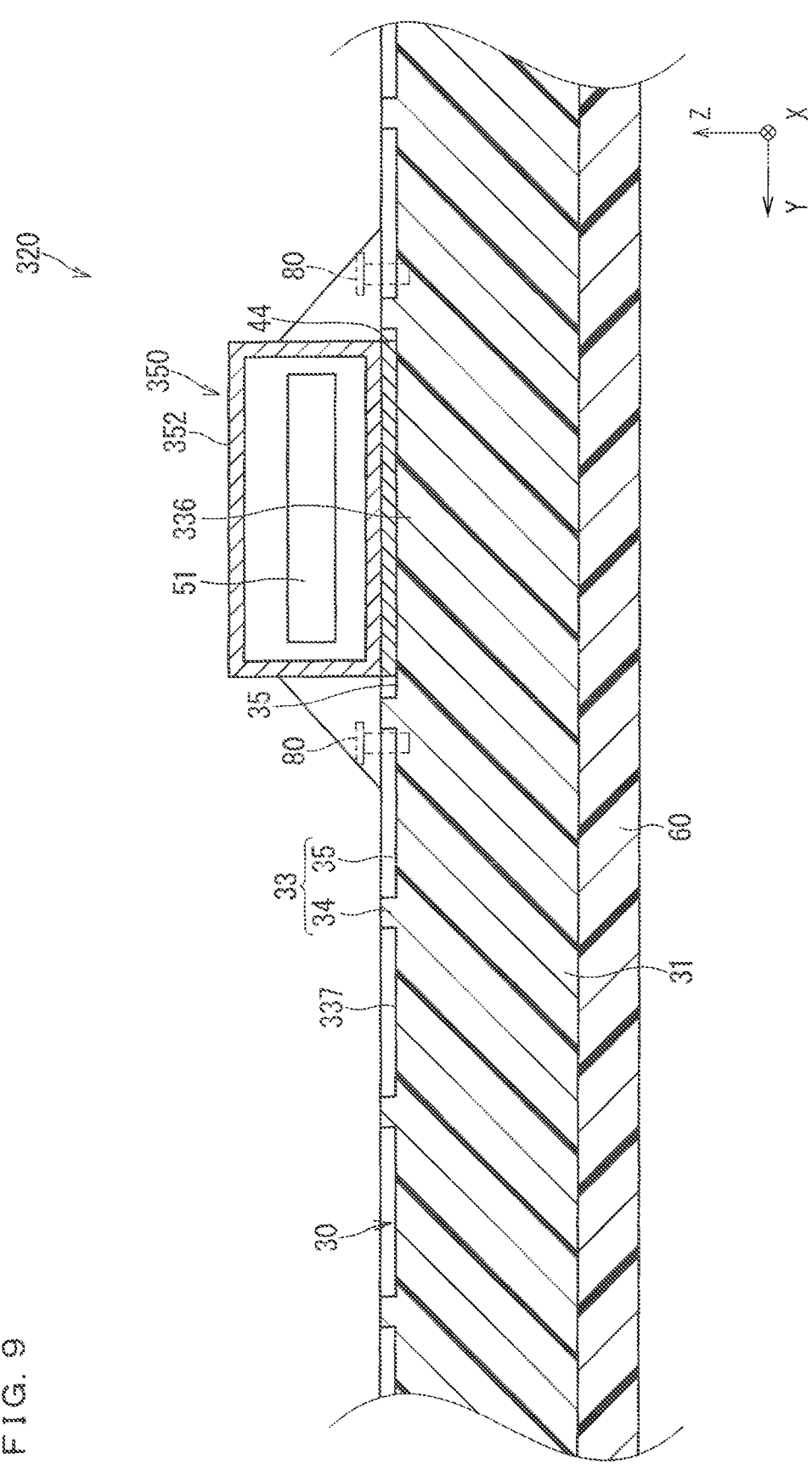
FIG. 9 is a cross-sectional view illustrating an apparatus module according to an embodiment 4.

An apparatus module according to an embodiment 4 is described. FIG. 9 is a cross-sectional view illustrating an apparatus module 320 according to the embodiment 4.

The heat transfer member 38 described above is not provided in the apparatus module 320. Heat from the apparatus 50 is transferred from a heat receiving part 336 to a heat radiation part 337 via the body part 31 by heat conduction. The heat radiation plate 37*a* described above is not provided in the apparatus module 320. The body part 31 wholly serves as the heat radiation part 337. The body part 31 functions as a heatsink. The concave-convex part 33 increases heat radiation properties. The heat receiving plate 36*a* described above is not provided in the apparatus module 320 according to the present example. A part of the body part 31 having contact with an apparatus 350 serves as the heat receiving part 336. An area in which the apparatus 350 and the heat receiving part 336 have contact with each other is preferably as large as possible. For example, it is applicable that a bottom surface of the concave part 35 serves as the heat receiving part 336 and a whole or large part (for example, 80% or more) of the bottom surface of the apparatus 350 has contact with the heat receiving part 336.

The apparatus module 320 includes a heat conductive member 44. The heat conductive member 44 intervenes between a surface of the apparatus 350 and a surface of the heat receiving part 336. The heat conductive member 44 fills a gap between the surface of the apparatus 350 and the surface of the heat receiving part 336. Accordingly, interfacial thermal resistance between the apparatus 350 and the heat receiving part 336 is reduced by the heat conductive member 44, and heat of the apparatus 350 can be further transferred to the heat receiving part 336 more efficiently. The heat conductive member 44 is not particularly limited, however, various types of heat conductive member 44 can be used. For example, the heat conductive member 44 may be a semisolid member such as a heat conductive grease. For example, the heat conductive member 44 may be a member which can be compressed and deformed such as a heat conductive sheet or a heat conductive rubber. In the present example, the apparatus 350 and the rigid member 30 are fixed by a fixing member 80 different from the heat conductive member 44. The fixing member 80 may be a screw, a clip, or a rivet, for example. When the apparatus 350 and the rigid member 30 are fixed by the fixing member 80, the heat conductive member 44 is compressed between the apparatus 350 and the rigid member 30. The heat conductive member 44 may fix the apparatus 350 and the rigid member 30. Such a heat conductive member 44 may be a heat conductive adhesive agent.

In the present example, the through hole 53 described above is not formed in a casing 352 of the apparatus 350. The casing 352 has contact with the beat receiving part 336 via the heat conductive member 44. Also in the present example, it is also applicable that the through hole 53 is formed in the casing 52 of the apparatus 50, and the apparatus body 51 and the heat receiving part 336 have contact with each other via the heat conductive member 44 through the through hole 53 as with the embodiment 1.

Modification Example

Figure 10:
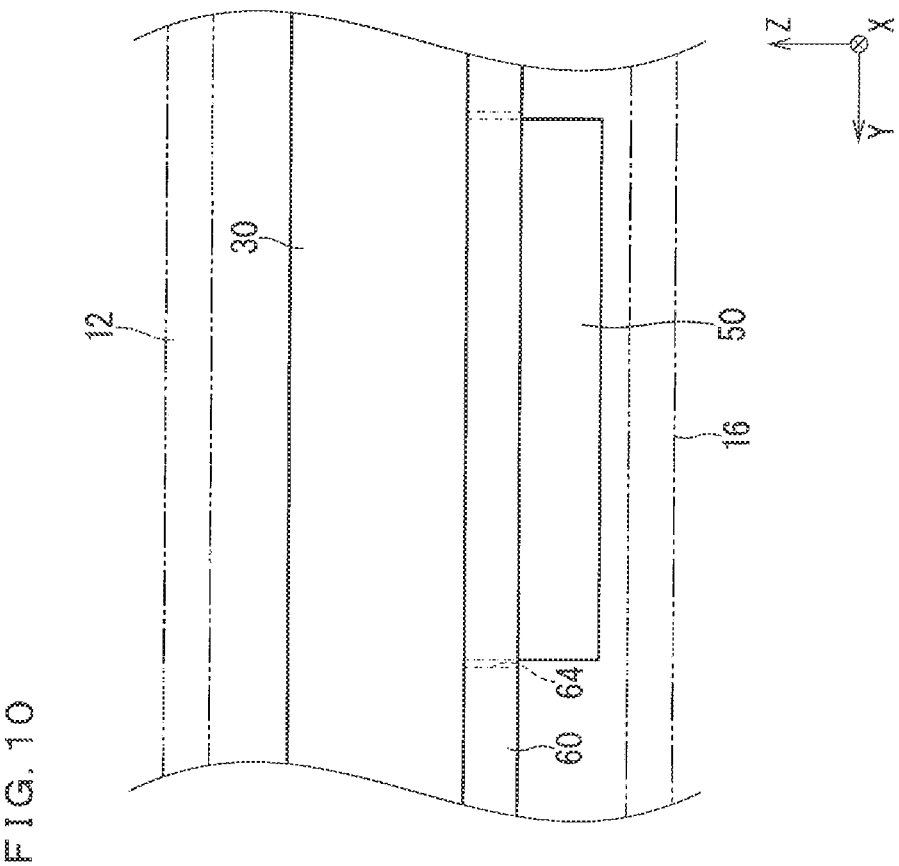
FIG. 10 is an explanation drawing illustrating a modification example of a positional relationship between a rigid member, an apparatus, and a functional sheet.
Figure 11:
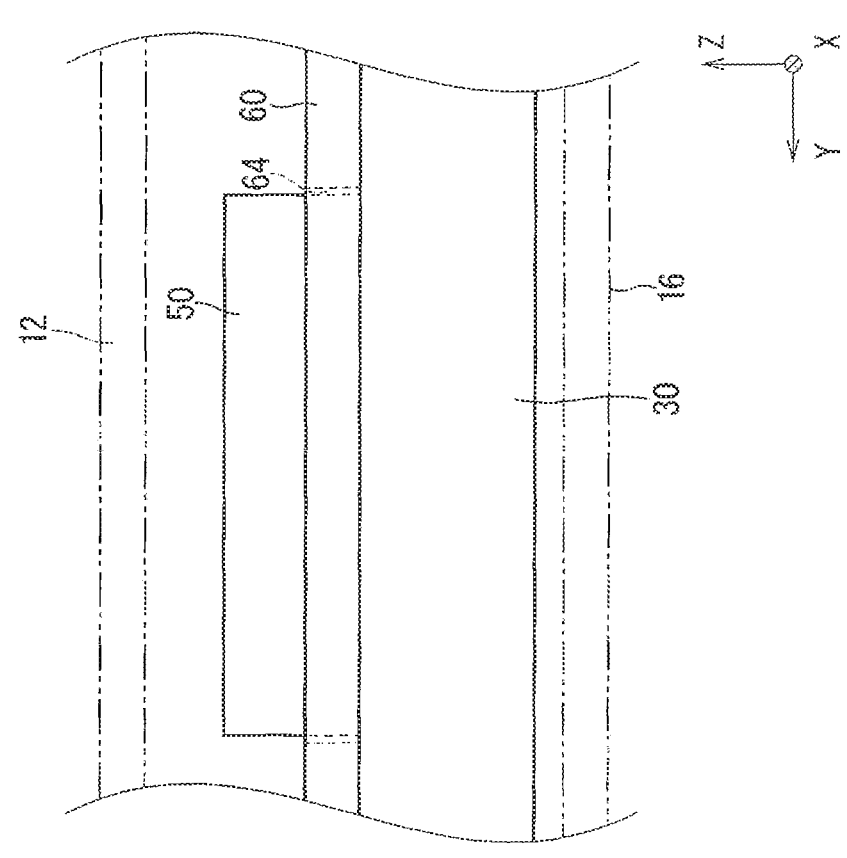
FIG. 11 is an explanation drawing illustrating a modification example of a positional relationship between a rigid member, an apparatus, and a functional sheet.
Figure 12:
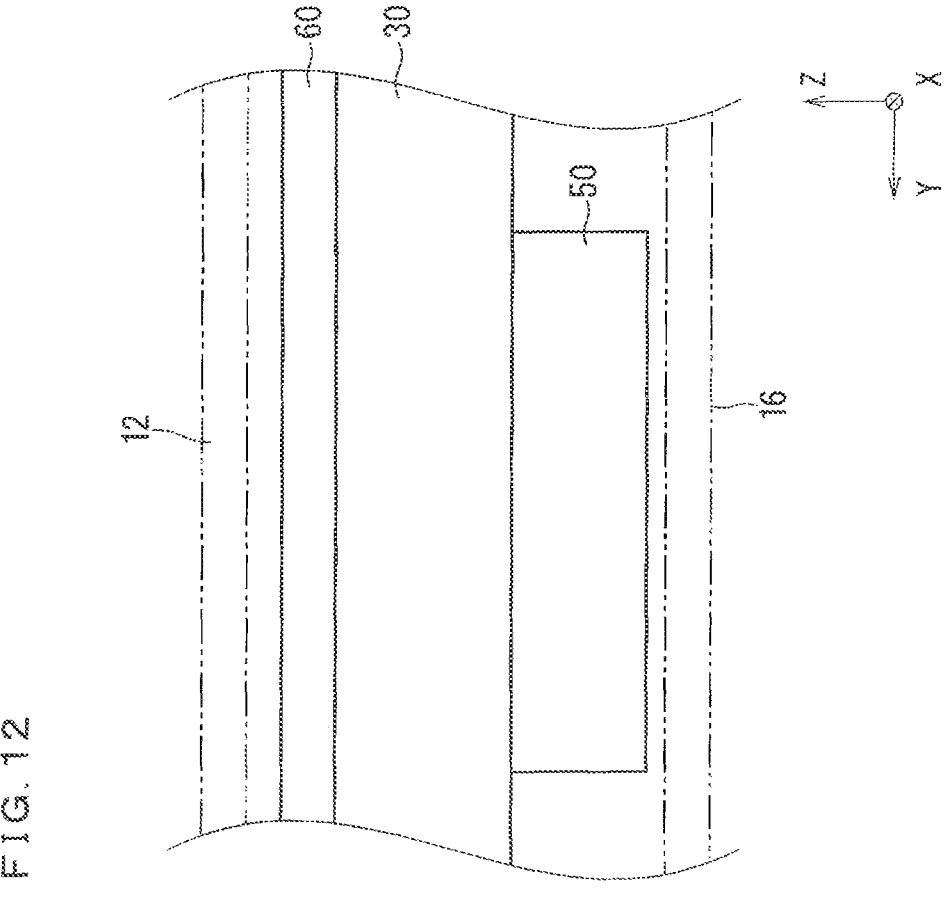
FIG. 12 is an explanation drawing illustrating a modification example of a positional relationship between a rigid member, an apparatus, and a functional sheet.

FIG. 10 to FIG. 12 are explanation drawings each illustrating a modification example of a positional relationship between the rigid member 30, the apparatus 50, and the functional sheet 60. In the example described above, the rigid member 30 is provided to the upper surface of the functional sheet 60, and the apparatus 50 is provided to the upper surface of the rigid member 30, however, this configuration is not necessary. For example, it is applicable that the rigid member 30 is provided to the upper surface of the functional sheet 60 and the apparatus 50 is provided to the lower surface of the rigid member 30 as illustrated in FIG. 10 as an example. For example, it is applicable that the rigid member 30 is provided to the lower surface of the functional sheet 60 and the apparatus 50 is provided to the upper surface of the rigid member 30 as illustrated in FIG. 11 as an example. For example, it is applicable that the rigid member 30 is provided to the lower surface of the functional sheet 60 and the apparatus 50 is provided to the lower surface of the rigid member 30 as illustrated in FIG. 12 as an example. When the apparatus 50 is disposed on the surface of the rigid member 30 directed to the functional sheet 60 as illustrated in FIG. 10 and FIG. 11 as an example, the window part 64 may be formed in a part of the functional sheet 60 where the apparatus 50 is disposed. The apparatus 50 may protrude outside the other surface of the functional sheet 60 through the window part 64. In the example illustrated in FIG. 10 to FIG. 12, the position of the heat radiation part 37 is optionally set, thus the heat radiation part 37 may be provided to any of the upper surface, the side surface, and the lower surface of the body part 31.

Moreover, in the above description, the heat transfer member 38 includes the heat pipe 39, however, this configuration is not necessary. A member having a higher thermal conductivity than the body part 31 may be provided as a heat transfer member in place of the heat pipe 39. In this case, the heat transfer member transfers the heat from the heat receiving part 36 to the heat radiation part 37 by heat conduction. Any combination of the body part 31 and the heat transfer member can be appropriately set as long as it is a combination having thermal conductivities different from each other. For example, it is applicable that the body part 31 is made of resin and the heat transfer member is made of metal. For example, it is applicable that the body part 31 is made of metal having a low thermal conductivity and the heat transfer member is made of metal having a high thermal conductivity.

In the above description, at least a part of the heat transfer member 38 is provided to the inner part of the body part 31, however, this configuration is not necessary. For example, the heat transfer member 38 may be wholly disposed on the surface of the body part 31.

In the above description, the apparatus module 20 includes the functional sheet 60 fixed to the rigid member 30, however, this configuration is not necessary. The apparatus module 20 may not include the functional sheet 60 fixed to the rigid member 30. For example, the in-roof space may not be provided with the functional sheet 60. For example, it is applicable that the functional sheet 60 is not fixed to the roof panel 12 by the rigid member 30 but is fixed to the interior member 16.

In the above description, the transmission member 70 extending from the apparatus 50 is provided to the functional sheet 60, however, this configuration is not necessary. The transmission member 70 may not be provided to the functional sheet 60. For example, the transmission member 70 may be provided to the interior member 16 or the roof panel 12. For example, it is applicable that the part a part of the transmission member 70 extending from the apparatus 50 is fixed to the rigid member 30 and a part thereof extending from the rigid member 30 is fixed to the roof panel 12.

The configurations described in the embodiments and modification examples thereof can be appropriately combined as long as they are not contradictory. For example, the heat conductive member 44 according to the embodiment 4 may be provided between the apparatus body 51 and the heat receiving plate 36a according to the embodiment 1 to the embodiment 3.

EXPLANATION OF REFERENCE SIGNS

10 vehicle
11 body
12 roof panel
13 frame
14 roof part
16 interior member
17 duct
18A, 18B, 18C flow path
19A, 19B vent
20, 120, 220, 320 apparatus module
30, 130 rigid member
31, 131 body part
32 support surface
33 concave-convex part
34 convex part (rib)
35 concave part
36, 336 heat receiving part
36a heat receiving plate
37, 337 heat radiation part
37a heat radiation plate
37b housing concave part
38 heat transfer member
39 heat pipe
40 container
40a first end portion
40b second end portion

41 cavity
42 roof fixing part
44 heat conductive member
50, 350 apparatus
51 apparatus body
52, 352 casing
53 through hole
60, 160 functional sheet
62, 64 window part
70 transmission member
80 fixing member

The invention claimed is:

1. An apparatus module, comprising:

a support disposed in an in-roof space between a roof panel and an interior member in a vehicle to be fixed to the roof panel; and an apparatus fixed to the support and having a casing, wherein the support is provided with a heat receiver comprising metal, wherein the heat receiver contacts the apparatus to receive heat from the apparatus and a heat radiator radiating heat received by the heat receiver, and wherein the heat radiator comprises metal, the heat receiver and the heat radiator are provided in positions away from each other in a surface of the support, wherein the heat receiver is provided to an upper surface of the support, and the heat radiator is provided to the upper surface, a side surface, or a lower surface of the support, heat is transferred from the heat receiver to the heat radiator via a heat transfer path connecting the heat receiver and the heat radiator in the support, the heat transfer path includes a path passing from a vertically-upper side to a lower side from the heat receiver toward the heat radiator, wherein an upper surface of the casing of the apparatus is opposed to the roof panel and heat is transferred from the vertically-upper side to the lower side in at least a part of the heat transfer path, and wherein the vertically-upper side is closer to the roof panel than the lower side is to the roof panel.

2. The apparatus module according to claim 1, wherein a heat transferor having a higher heat transfer efficiency than a body part of the support is provided as a member constituting the heat transfer path.

3. The apparatus module according to claim 1, wherein the heat transferor includes a heat pipe.

4. The apparatus module according to claim 1, wherein at least a part of the heat transferor is provided inside a body part of the support.

5. The apparatus module according to claim 1, further comprising a heat conductor intervening between a surface of the apparatus and a surface of the heat receiver to fill a gap between the surface of the apparatus and the surface of the heat receiver.

6. The apparatus module according to claim 1, wherein the radiator part is provided to a surface of the support directed to a side of the interior member.

7. The apparatus module according to claim 1, wherein the heat radiator is provided in a position facing a vent of a duct disposed in the in-roof space.

8. The apparatus module according to claim 1, comprising a sheet provided with the support and including a heat insulating layer.

9. The apparatus module according to claim 8, wherein the heat radiator is exposed to a side closer to the interior member in relation to the heat insulating layer.

10. The apparatus module according to claim 8, comprising a transmission member comprising an electrical wire or an optical fiber, and the transmission member provided to the sheet and connected to the apparatus.

11. An apparatus module, comprising:

a support disposed in an in-roof space between a roof panel and an interior member in a vehicle to be fixed to the roof panel; and an apparatus fixed to the support, wherein the support is provided with a heat receiving part having receiver comprising metal, wherein the heat receiver contacts the apparatus to receive heat from the apparatus and a heat radiator radiating heat received by the heat receiver, and wherein the heat radiator comprises metal, the heat receiver and the heat radiator are provided in positions away from each other in a surface of the support, heat is transferred from the heat receiver to the heat radiator via a heat transfer path connecting the heat receiver and the heat radiator in the support, the heat radiator is provided to a surface of the support directed to a side of the interior member, the apparatus module includes a sheet provided with the support, the sheet includes a heat insulating layer, wherein the support is provided between the roof panel and an upper side of the heat insulating layer that faces the roof panel, and a window part is formed in the sheet to expose the heat radiator through a lower side of the sheet that is opposite the upper side of the heat insulating layer.

\* \* \* \* \*